United States Patent
Chen et al.

(10) Patent No.: US 9,970,105 B2
(45) Date of Patent: May 15, 2018

(54) METHOD FOR SEALING PROCESSING MODULE

(71) Applicant: Taiwan Semiconductor Manufacturing Co., Ltd., Hsin-Chu (TW)

(72) Inventors: Chun-Ta Chen, Tainan (TW);
Cheng-Chieh Chen, Tainan (TW);
Hong-Hsing Chou, Jhubei (TW);
Yeh-Chieh Wang, Hsinchu (TW);
Jeng-Yann Tsay, Tainan (TW);
Shyue-Shin Tsai, Tainan (TW);
Tsung-Yang Liu, Tainan (TW)

(73) Assignee: TAIWAN SEMICONDUCTOR MANUFACTURING CO., LTD, Hsin-Chu (TW)

( * ) Notice: Subject to any disclaimer, the term of this patent is extended or adjusted under 35 U.S.C. 154(b) by 210 days.

(21) Appl. No.: 14/138,495

(22) Filed: Dec. 23, 2013

(65) Prior Publication Data

US 2015/0179456 A1  Jun. 25, 2015

(51) Int. Cl.
*C23C 16/44* (2006.01)
*H01L 21/67* (2006.01)
*H01J 37/32* (2006.01)

(52) U.S. Cl.
CPC .... *C23C 16/4409* (2013.01); *H01L 21/67126* (2013.01); *H01J 37/32513* (2013.01)

(58) Field of Classification Search
CPC .................................... F16K 1/54; F16K 3/12
USPC .......................................................... 118/733
See application file for complete search history.

(56) References Cited

U.S. PATENT DOCUMENTS

| 5,363,872 A | * | 11/1994 | Lorimer | F16K 1/10 |
| | | | | 137/1 |
| 2004/0089836 A1 | * | 5/2004 | Wu | F16K 3/0227 |
| | | | | 251/326 |
| 2011/0186762 A1 | * | 8/2011 | Geiser | F16K 51/02 |
| | | | | 251/303 |

FOREIGN PATENT DOCUMENTS

JP  2004141803 A  * 5/2004
WO  WO 2008029966 A1  * 3/2008  ............... F16K 3/12

* cited by examiner

*Primary Examiner* — Karla A Moore
(74) *Attorney, Agent, or Firm* — McClure, Qualey & Rodack, LLP

(57) ABSTRACT

Embodiments of method for cooling a wafer are provided. A method for cooling a wafer includes placing the wafer in a processing module via a passage of a seat member. The method also includes moving a closure member toward the seat member in a diagonal manner. The method further includes engaging the seat member and the closure member and placing a portion of the closure member inside the passage. In addition, the method includes performing a process on the wafer in the processing module.

20 Claims, 11 Drawing Sheets

METHOD FOR SEALING PROCESSING MODULE dielectric layers, conductive layers, and semiconductor layers of materials over a semiconductor substrate, and patterning the various material layers using lithography to form circuit components and elements thereon.

The semiconductor industry continues to improve the integration density of various electronic components (e.g., transistors, diodes, resistors, capacitors, etc.) by continual reductions in minimum feature size, which allows more components to be integrated into a given area. These smaller electronic components also require smaller packages that utilize less area than the packages of the past, in some applications.

During the manufacturing of the semiconductor devices, various processing steps are used to fabricate integrated circuits on a semiconductor wafer. Generally, the process includes steps performed in a process chamber of a processing module. When the process is performed, the process chamber is sealed so that the process gas is kept within the process chamber and contaminants from outside are prevented from entering the process chamber.

Although existing methods and device for sealing the process chamber have been generally adequate for their intended purposes, they have not been entirely satisfactory in all respects. Consequently, it would be desirable to provide a solution for sealing the process chamber in a semiconductor wafer process apparatus.

BRIEF DESCRIPTION OF THE DRAWINGS

For a more complete understanding of the embodiments, and the advantages thereof, reference is now made to the following descriptions taken in conjunction with the accompanying drawings, in which.

DETAILED DESCRIPTION OF THE ILLUSTRATIVE EMBODIMENTS

The making and using of the embodiments of the disclosure are discussed in detail below. It should be appreciated, however, that the embodiments can be embodied in a wide variety of specific contexts. The specific embodiments discussed are merely illustrative, and do not limit the scope of the disclosure.

It is to be understood that the following disclosure provides many different embodiments, or examples, for implementing different features of the disclosure. Specific examples of components and arrangements are described below to simplify the present disclosure. These are, of course, merely examples and are not intended to be limiting. Moreover, the performance of a first process before a second process in the description that follows may include embodiments in which the second process is performed immediately after the first process, and may also include embodiments in which additional processes may be performed between the first and second processes. Various features may be arbitrarily drawn in different scales for the sake of simplicity and clarity. Furthermore, the formation of a first feature over or on a second feature in the description that follows include embodiments in which the first and second features are formed in direct contact, and may also include embodiments in which additional features may be formed between the first and second features, such that the first and second features may not be in direct contact.

FIGS. 1-12 have been simplified for the sake of clarity to better understand the inventive concepts of the present disclosure. Throughout the various views and illustrative embodiments, like reference numbers are used to designate like elements.

Figure 1:
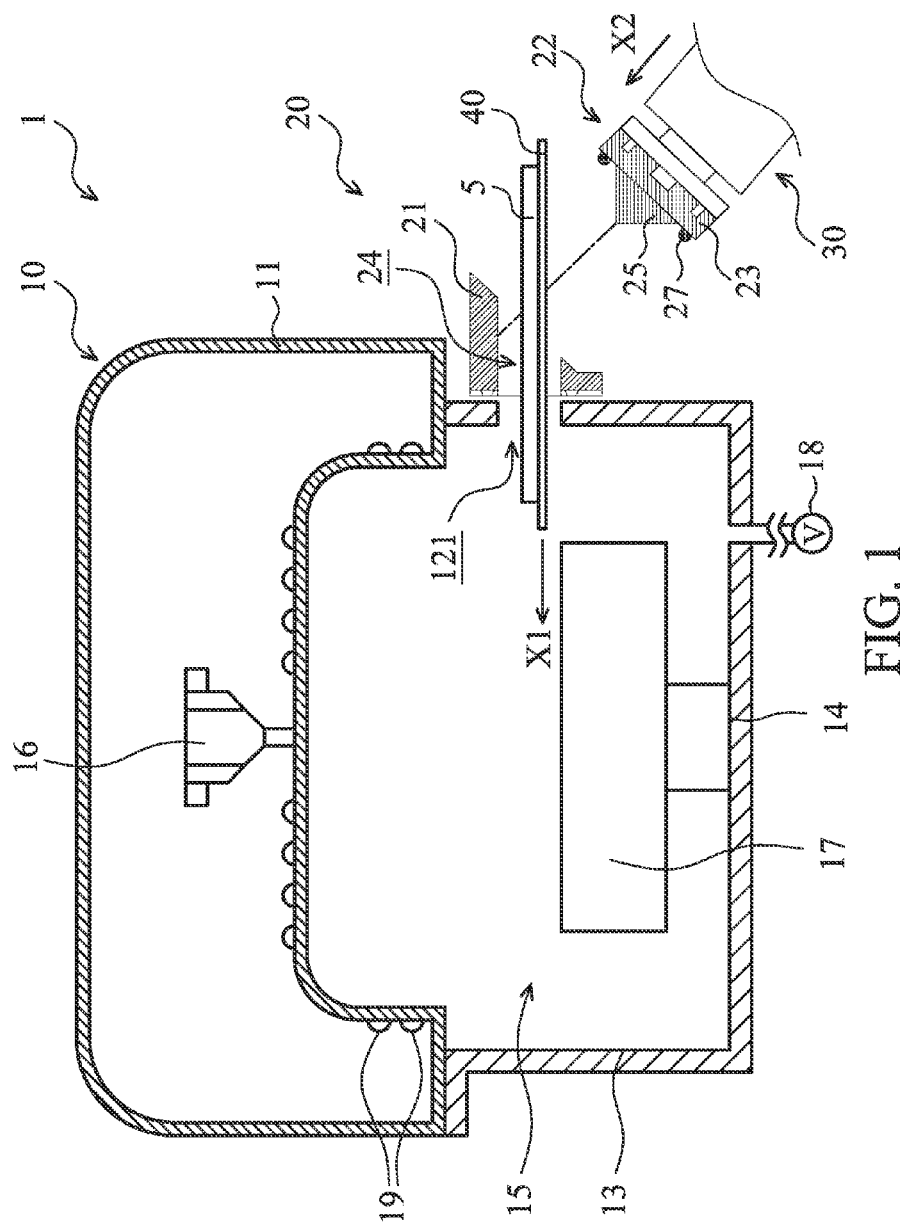
FIG. 1 is a cross-sectional view of a wafer process apparatus with a closed sealing module, in accordance with some embodiments.

Referring to FIG. 1, a cross-sectional view of a wafer process apparatus 1 as a sealing module 20 being in open state is shown, in accordance with some embodiments. The wafer process apparatus 1 is configured to process one or more wafers 5. The wafer 5 may include a semiconductor, conductor, and/or insulator layers. In some embodiments, the wafer 5 includes layered semiconductors. Examples include the layering of a semiconductor layer on an insulator such as that used to produce a silicon-on-insulator (SOI) substrate, a silicon-on-sapphire substrate, or a silicon-germanium-on-insulator substrate, or the layering of a semiconductor on glass to produce a thin film transistor (TFT). The wafer 5 may go through many processing steps, such as lithography, etching, and/or doping before a completed die is formed.

In some embodiments, the wafer process apparatus 1 includes a processing module 10, a sealing module 20, an actuator module 30, and a wafer handling module 40. The wafer handling module 40 is configured to move the wafer 5 into the processing module 10 or move the wafer 5 out of the processing module 10. The actuator module 30 is configured to transfer a closure member 22 to enable the sealing module to be in an open or closed state. Structural features of each module will become apparent from the following description and drawings. Additional features can be added to the wafer process apparatus, and some of the features described below can be replaced or eliminated in other embodiments of the wafer process apparatus.

In some embodiments, the processing module 10 is used to perform a process that exposes its contents to highly corrosive environments. For example, the processing module 10 is configured to form a film on the surface of the wafer 5 by high density plasma (HDP). However, it is appreciated the wafer process apparatus 1 may be used to perform any process, such as etching, plasma enhanced, high density plasma, ultrahigh vacuum, microwave plasma-assisted and sputtering processes.

The processing module 10 includes a dome 11 and a number of panels, such as lateral panels 12 and 13 and a bottom panel 14, a plasma source 16, a susceptor 17, a vacuum source 18, and a number of coils 19, in accordance with some embodiments. The lateral panels 12 and 13 connect to the bottom panel 14, and the dome 11 is positioned over the lateral panels 12 and 13. An enclosure 15 of the processing module 10 is defined by the dome 11, the bottom panel 14, and the lateral panels 12 and 13. The lateral panel 12 has an opening 121 for facilitating placement or removal of the wafer 5. The plasma source 16 and the vacuum source 18 are connected to the disclosure 15 for producing a flow of process elements, such as plasma. The susceptor 17, for example an electrostatic chuck (ESC), is positioned in the disclosure 15 for supporting the wafer 5. The coils 19 are positioned at a top portion of the disclosure 15 for facilitating the plasma process.

Figure 2:
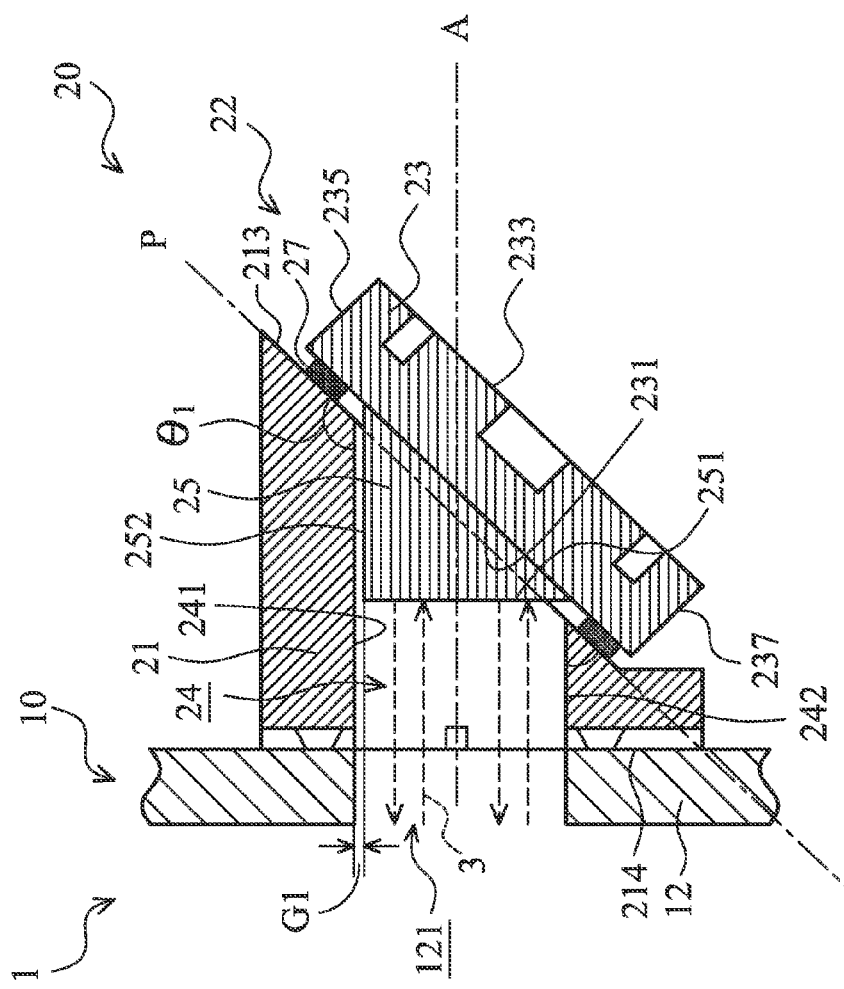
FIG. 2 is a partial cross-sectional view of a wafer process apparatus with a closed sealing module, in accordance with some embodiments.

In some embodiments, the sealing module 20 is selectively closed to seal the enclosure 15 once the wafer 5 has been inserted in the processing module 10. Referring to FIG. 2, a partial cross-sectional view of the wafer process apparatus 1 with a closed sealing module is shown, in accordance with some embodiments. In some embodiments, the sealing module 20 includes a seat member 21, a closure member 22, and a sealing member 27.

In some embodiments, the seat member 21 has an outer surface 213 and an inner surface 214, and a passage 24 penetrates the outer surface 213 and the inner surface 214. The passage 24 substantially extends along an extending axis A and communicates with the opening 121 of the lateral panel 12. In some embodiments, the extending axis A is horizontal. As shown in FIG. 1, in some embodiments, the passage 24 is sufficiently wide and high to permit the passing of the wafer 5 supported by the wafer handling module 40, such as a robotic wafer handling arm. In some embodiments, when the wafer 5 transferred by the actuator module 30 passes through the passage 24, the wafer 5 is moved along a first direction X1 parallel to the extending axis A.

Referring again to FIG. 2, in some embodiments, the passage 24 has a top wall 241 and a bottom wall 242 opposite to the top wall 241. The top wall 241 and the bottom wall 242 are parallel to the extending axis A and respectively connect the inner surface 214 to the outer surface 213. In some embodiments, the outer surface 213 lies in a plane P. An angle $\theta_1$ formed between the top wall 241 and the outer surface 213 is in a range from 90 degrees to 135 degrees.

In some embodiments, the closure member 22 includes a main body 23 and a barrier 25. The main body 23 is an elongated structure and comprises a front surface 231, a rear surface 233, a number of edges, such as an upper edge 235 and a lower edge 237. The rear surface 233 is opposite to the front surface 231, and the upper edge 235 and the lower edge 237 are located between the front surface 231 and the rear surface 233. In some embodiments, the front surface 231 is a planar surface, and one or more means of positioning, such as positioning holes or positioning pins, are formed on the rear surface 233 for facilitating the engagement of the actuator module 30 (FIG. 1). In some embodiments, when the sealing module 20 is in a closed state, the upper edge 235 is adjacent to the top wall 241, and the lower edge 237 is adjacent to the bottom wall 242.

The barrier 25 is positioned on the front surface 231. In some embodiments, the barrier 25 is triangular in cross section and has a first lateral surface 251 and a second lateral surface 252. As shown in FIG. 2, in some embodiments, when the sealing module 20 is in closed state, the barrier 25 is placed inside the passage 2. The first lateral surface 251 is arranged being perpendicular to the extending axis A, and the second lateral surface 252 is adjacent to the upper wall 241 of the passage 24. In some embodiments, the second lateral surface 252 is not in contact with the upper wall 241 of the passage 24, and a gap G1 is formed between the second lateral surface 252 and the upper wall 241 of the passage 24. In some embodiments, the width of the gap G1 is in a range from about 0.2 mm to about 2.0 mm. In some embodiments, the barrier 25 is made of anti-corrosion material, such as, aluminum, teflon, ceramic, aluminum oxide, silicon carbon, aluminum nitride, etc. The configuration of the barrier 25 should not be limited to the above-mentioned embodiments. Different configurations of the barrier 25 are described in connection with FIGS. 3-10.

In some embodiments, the sealing member 27 is positioned on the front surface 231 of the main body 23 and surrounds the barrier 25. However, the position of the sealing member 27 should not be limited thereto. In some other non-illustrated embodiments, the sealing member 27 is positioned on the outer surface 213 of the seat member 21, and the sealing member 27 surrounds the barrier 25 when the closure member 22 engages with the seat member 21. The sealing member 27 is deformed after being compressed by the outer surface 213 of the seat member 21 and the front surface 231 of the main body 23. In some embodiments, the sealing member 27 is an elastomeric gasket or a seal, such as an O-ring seal. However, the sealing member 27 can be made of any suitable material.

In some embodiments, the sealing module 20 is maintained in the closed state by the pressure differences at two sides of the closure member 22. For example, while the processing module 10 (FIG. 1) is in operation, the pressure on inside the closure member 22 is as low as about $10^{-8}$ Psi, and the pressure on outside of the closure member 22 is as high as atmospheric pressure. Therefore, the closure member 22 is pushed toward the seat member 21 by the atmospheric pressure, so that the sealing module 20 is compressed by the seat member 21 and the closure member 23. Since the closure member 22 firmly engages with the seat member 21, a proper seal of the processing module 10 (FIG. 1) is ensured.

As shown in FIG. 2, since the passage 24 is connected to the opening 121, the processing elements 3 from the processing module 10 will enter the passage 24 while the process is performed. After a period of use, an erosion of the sealing member 27 may occur due to the exposure of the processing elements 3. However, in the embodiments as shown in FIG. 2, in some embodiments, the processing elements 3 are reflected by the first surface 521 of the barrier 25. The processing elements 3 are block from striking the sealing member 27 directly. Therefore, the erosion problem of the sealing member 27 is mitigated. The lifespan of the sealing member 27 is increased, and the airtight seal afforded by the sealing module 20 is ensured.

Figure 3:
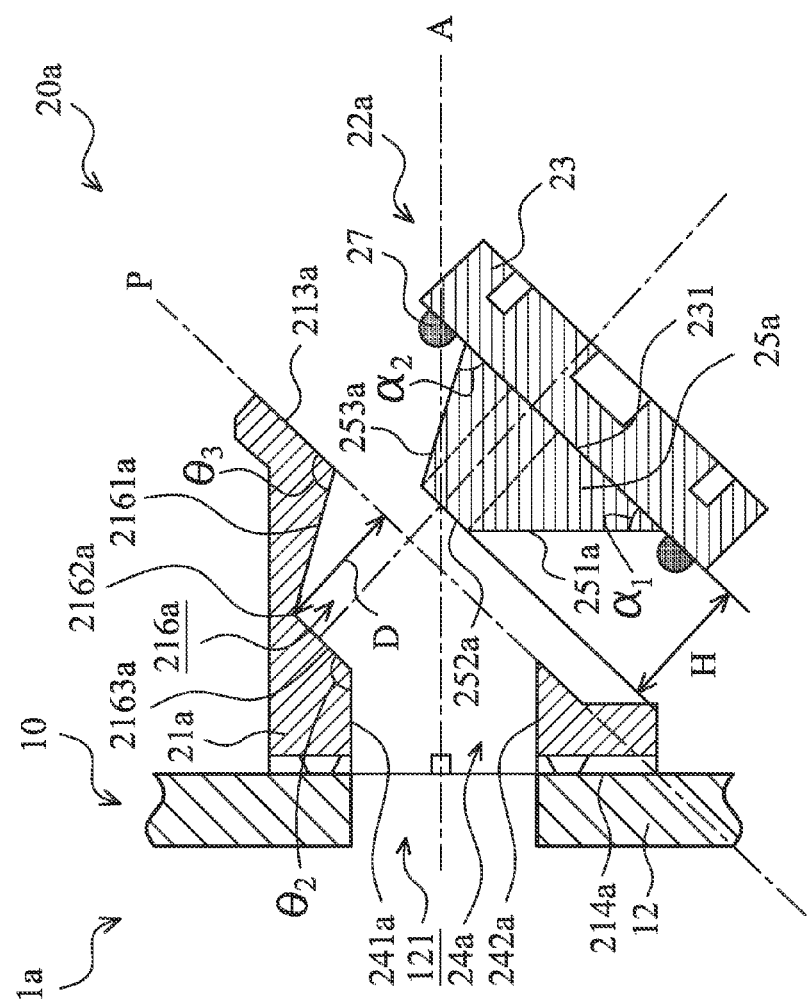
FIG. 3 is a partial cross-sectional view of a wafer process apparatus with an open sealing module, in accordance with some embodiments.

Referring to FIG. 3, a partial cross-sectional view of a wafer process apparatus 1a with an open sealing module 20a is shown, in accordance with some embodiments. The sealing module 20a includes a seat member 21a, a closure member 22a, and the sealing member 27. In some embodiments, the seat member 21a has an outer surface 213a and an inner surface 214a, and a passage 24a penetrates the outer surface 213a and the inner surface 214a. The passage 24a substantially extends along an extending axis A and communicates with the opening 121 of the lateral panel 12. In some embodiments, the extending axis A is horizontal. The passage 24a has a top wall 241a and a bottom wall 242a opposite to the top wall 241a. The top wall 241a and the bottom wall 242a are parallel to the extending axis A and respectively connect the inner surface 214a to the outer surface 213a which lies in a plane P.

In some embodiments, a recessed portion 216a is formed on the top wall 241a of the passage 24a. The recessed portion 216a includes a first recessed surface 2161a and a second recessed surface 2163a. The first recessed surface 2161a is located between the second recessed surface 2163a and the outer surface 213a. In some embodiments, an angle $\theta_2$ formed between the second recessed surface 2163a and the inner wall 241a of the passage 24a is in a range from 90 degrees to 135 degrees. In addition, an angle $\theta_3$ formed between the first recessed surface 2161a and the outer surface 213a is in a range from 90 degrees to 110 degrees. The distance D between the intersection point 2162a of the first recessed surface 2161a and the second recessed surface 2163a to the plane P is in a range from is greater than 0 and less than about 14.5 mm.

Figure 4:
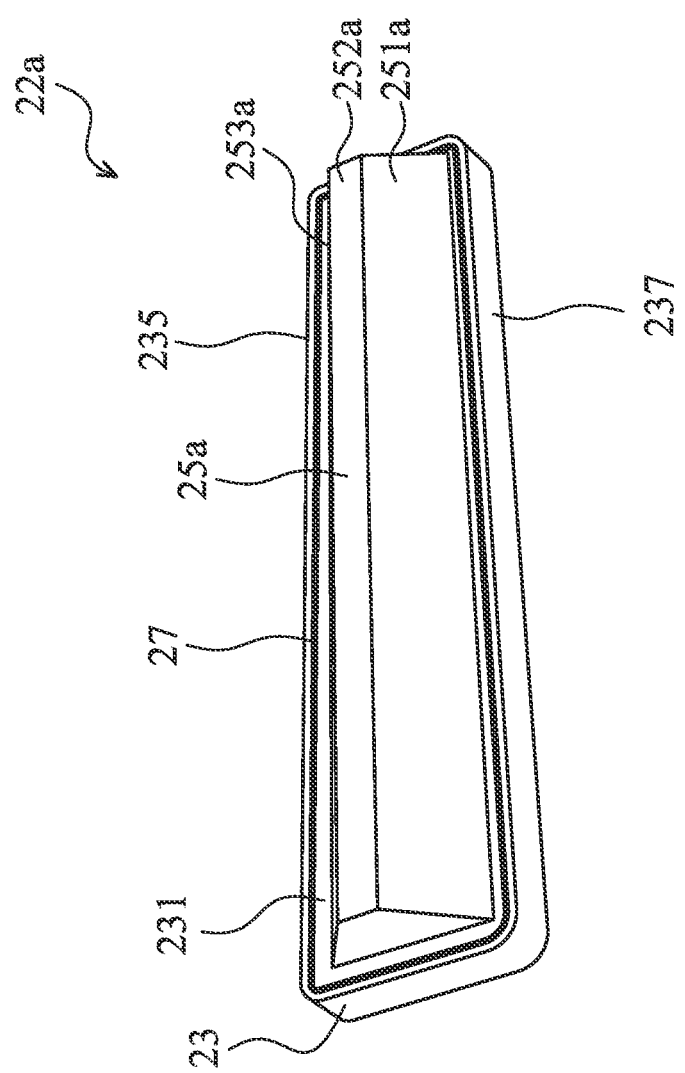
FIG. 4 is a schematic view of a closure member and a sealing member, in accordance with some embodiments.

The closure member 22a includes the main body 23 and a barrier 25a, in accordance with some embodiments. The barrier 25a is positioned on the front surface 231 of the main body 23. Referring to FIG. 4, a schematic view of the closure member 22a and the sealing member 27 is shown, in accordance with some embodiments. In some embodiments, the barrier 25a is trapezoidal in cross section and has a first lateral surface 251a, a top surface 252a, and a second lateral surface 253a. The top surface 252a is parallel to the front surface 231. The first lateral surface 251a and the second lateral surface 253a respectively connects two opposite sides of the top surface 252a to the front surface 231. In some embodiments, an angle $\alpha_1$ (FIG. 3) formed between the first lateral surface 251a and the front surface 231 is in a range from 45 degrees to 90 degrees. In some embodiments, an angle $\alpha_2$ (FIG. 3) formed between the second lateral surface 253a and the front surface 231 is in a range from 70 degrees to 90 degrees. In some embodiments, the height H of the barrier 25a from the top surface 252a to the front surface 231 is greater than 0 and less than about 14.5 mm.

Figure 5A:
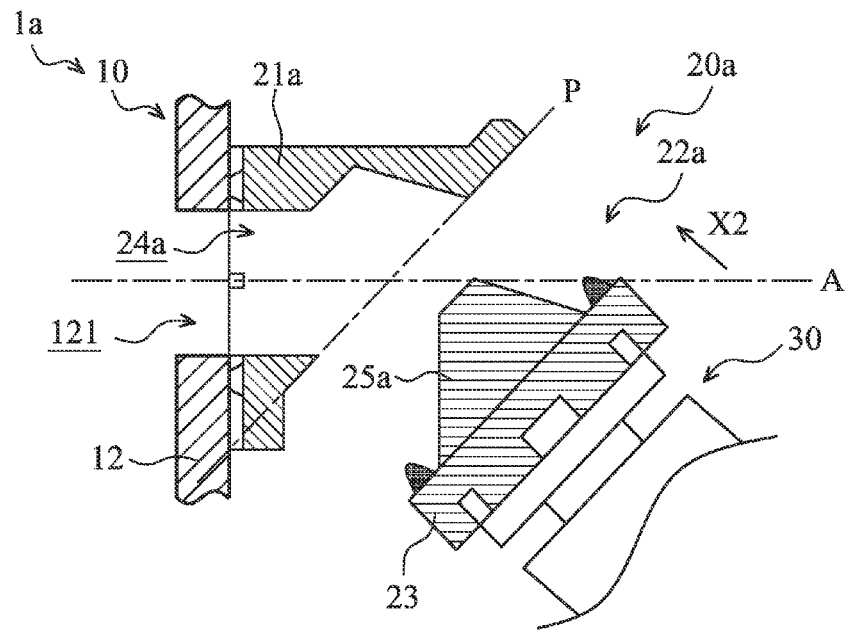
FIGS. 5A-5C are cross-sectional views of stages of a process for closing a sealing module, in accordance with some embodiments.
Figure 5B:
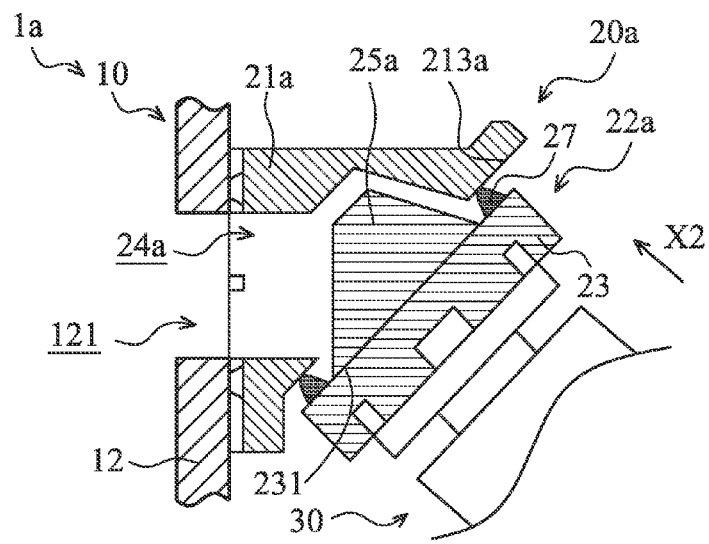
Figure 5C:
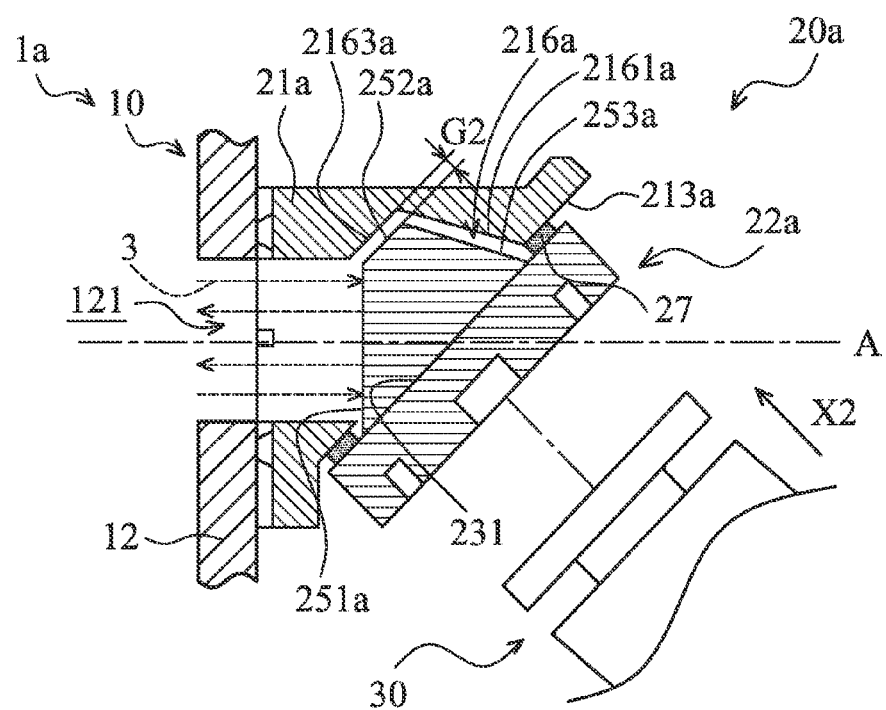

Referring to FIGS. 5A-5C, cross-sectional views of stages of a process for closing the sealing module 20a are shown, in accordance with some embodiments. In some embodiments, after the wafer (not shown in FIGS. 5A-5C) is placed in the processing module 10, and after the wafer-handling module (not shown in FIGS. 5A-5C) is retrieved from the processing module 10, the sealing module 20a is actuated to close. As shown in FIG. 5A, to close the sealing module 20a, the closure member 22a is moved toward the seat member 21a by the actuator module 30. In some embodiments, the closure member 22a is moved along the transferring direction X2 that is different from the extending axis A along which the passes 24a extend. Namely, the closure member 22a is moved toward the seat member 21a in a diagonal manner.

As shown in FIG. 5B, with the continuous movement of the closure member 22a along the transferring direction X2, the sealing member 27 is in contact with the outer surface 213a of the seat member 21a, and the barrier 25a of the closure member 22a is placed inside of the passage 24. In some embodiments, the moving speed of the closure member 22a in the transferring direction X2 is gradually decreased when the closure member 22a approaches the seat member 21a. Since the closure member 22a is inserted into the passage 24a at a slow speed, a collision of the barrier 25a with the seat member 21a is prevented.

As shown in FIG. 5C, when the sealing module 20a is in closed state, the closure member 22a engages with the seat member 21a. Specifically, when the sealing module 20a is in closed state, a portion of the barrier 25a is located in the recessed portion 216a. The second lateral surface 253a is adjacent to the first recessed surface 2161a, and the top surface 253a is adjacent to the second recessed surface 2163a. In some embodiments, the configuration of the recessed portion 216a is compatible with the configuration of the portion of the barrier 25a that is located in the recessed portion 216a. Therefore, the barrier 25 is not in contact with the first and second recessed surfaces 2161a and 2163a of the recessed portion 216a. The collision of the barrier 25a with the seat member 21a is prevented even if a misalignment has occurred.

In some embodiments, a gap G2 is formed between the top surface 252a and the second recessed surface 2163a or between the second lateral surface 253a and the first recessed surface 2161a. In some embodiments, the width of the gap G2 is greater than 0 mm and less than about 2.0 mm. In some embodiments, the width of the gap G2 between the top surface 252a and the second recessed surface 2163a is adjustable by moving the seat member 22a along the transferring direction X2.

Figure 6:
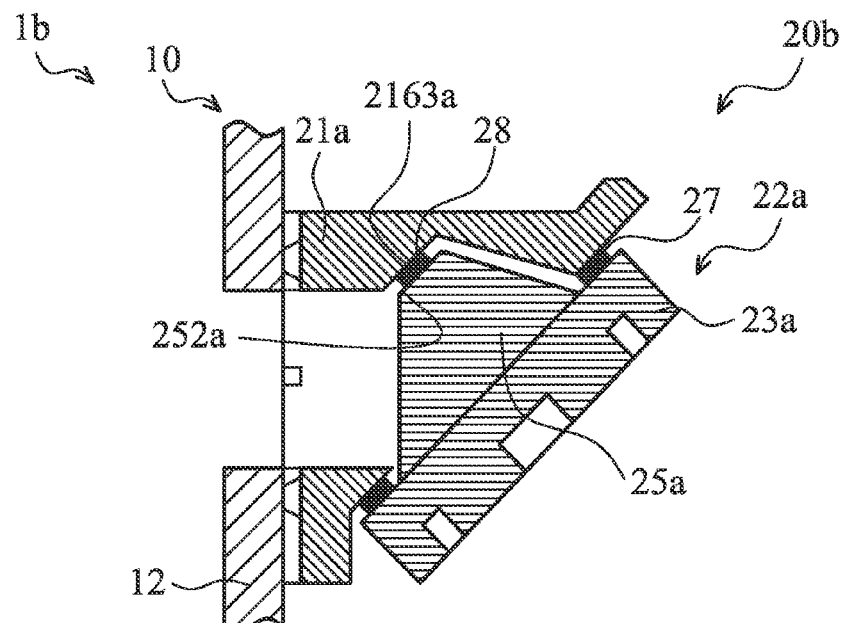
FIG. 6 is a partial cross-sectional view of a wafer process apparatus, in accordance with some embodiments.

Referring to FIG. 6, a partial cross-sectional view of a wafer process apparatus 1b with a closed sealing module 20b is shown, in accordance with some embodiments. Differences between the sealing module 20b and the sealing module 20a include a buffer member 28 arranged between the top surface 252a of the barrier 25a and the second recessed surface 2163a of the seat member 21a. In some embodiments, the buffer member 28 is positioned on the top surface 252a of the barrier 25a. In some other embodiments, the buffer member 28 is positioned on the second recessed surface 2163a of the seat member 21a. With the buffer member 28 in place, damage to the barrier 25a or the seat member 21a caused by collision can be avoided.

Figure 7:
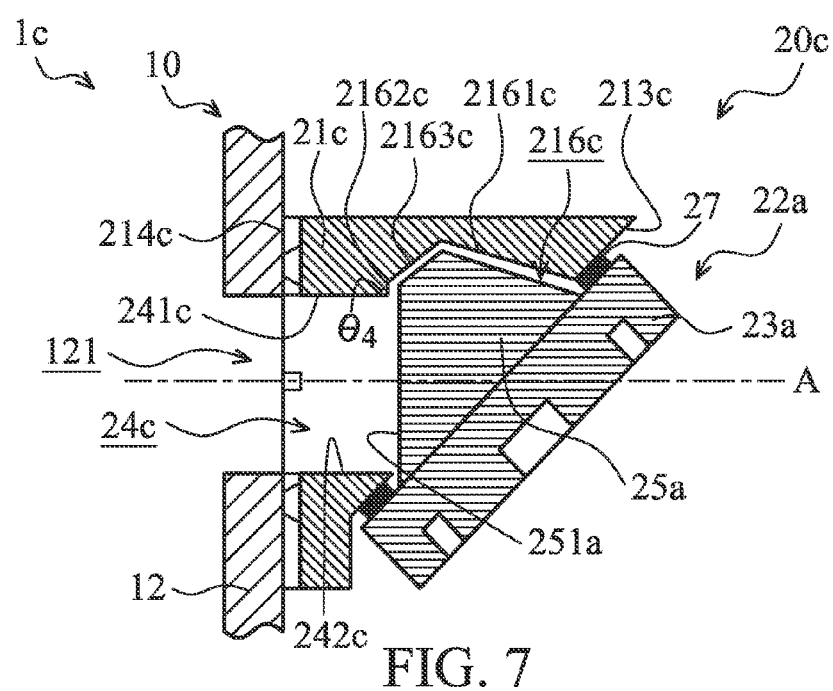
FIG. 7 is a partial cross-sectional view of a wafer process apparatus, in accordance with some embodiments.

Referring to FIG. 7, a partial cross-sectional view of a wafer process apparatus 1c with a closed sealing module 20c is shown, in accordance with some embodiments. Differences between the sealing module 20c and the sealing module 20a include the seat member 21a being replaced by a seat member 21c. In some embodiments, the seat member 21c has an outer surface 213c and an inner surface 214c, and a passage 24c penetrates the outer surface 213c and the inner surface 214c. The passage 24c substantially extends along an extending axis A and communicates with the opening 121 of the processing module 10. In some embodiments, the extending axis A is horizontal. The passage 24c has a top wall 241c and a bottom wall 242c opposite to the top wall 241c. The top wall 241c and the bottom wall 242c are parallel to the extending axis A and respectively connect the inner surface 214c to the outer surface 213c.

In some embodiments, a recessed portion 216c is formed on the top wall 241c of the passage 24c. The recess portion 216c includes a first recessed surface 2161c, a second recessed surface 2162c, and a third recessed surface 2163b. The first recessed surface 2161c is adjacent to the outer surface 213c, and the third recessed surface 2163c connects the first recessed surface 2161c to the second recessed surface 2162c. The second recessed surface 2162c connects the third recessed surface 2163c to the top wall 241c of the passage. In some embodiments, an angle formed between the second recessed surface 2162c and the top wall 241c is in a range from 90 degrees to 135 degrees. With such an arrangement, better protection of the portion of the sealing member 27 approximating the upper edge 235 is achieved.

Figure 8:
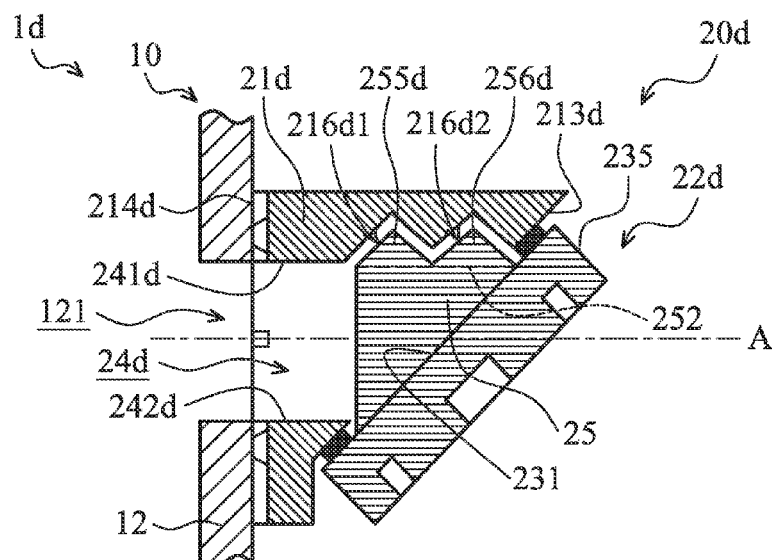
FIG. 8 is a partial cross-sectional view of a wafer process apparatus, in accordance with some embodiments.

Referring to FIG. 8, a partial cross-sectional view of a wafer process apparatus 1d with a closed sealing module 20d is shown, in accordance with some embodiments. Differences between the sealing module 20d and the sealing module 20 include the seat member 21 being replaced by a seat member 21d and the closure member 22d further including two protrusions 255d and 256d.

In some embodiments, the seat member 21d has an outer surface 213d and an inner surface 214d, and a passage 24d penetrates the outer surface 213d and the inner surface 214d. The passage 24d substantially extends along an extending axis A and communicates with the opening 121 of the processing module 10. In some embodiments, the extending axis A is horizontal. The passage 24d has a top wall 241d and a bottom wall 242d opposite to the top wall 241d. The top wall 241d and the bottom wall 242d are parallel to the extending axis A and respectively connect the inner surface 214d to the outer surface 213d.

Two recessed portions 216d1 and 216d2 are formed on the top wall 211d of the passage 24d. The two protrusions 255d and 256d are formed on the second lateral surface 252 of the barrier 25. The protrusion 255d has a configuration compatible with the recessed portions 216d1, and the protrusion 256d has a configuration compatible with the recessed portions 216d2. As shown in FIG. 8, when the sealing module 20d is in closed state, the two protrusions 255d and 256d are respectively located in the recessed portions 216d1 and 216d2. With such an arrangement, better protection of the sealing member 27 located adjacent to the upper edge 235 is achieved. In some embodiments, the two protrusions 255d and 256d are made of anti-corrosion material, such stainless steel, etc. In some embodiments, the two protrusions 255d and 256d and the barrier 25 are formed integrally.

Figure 9:
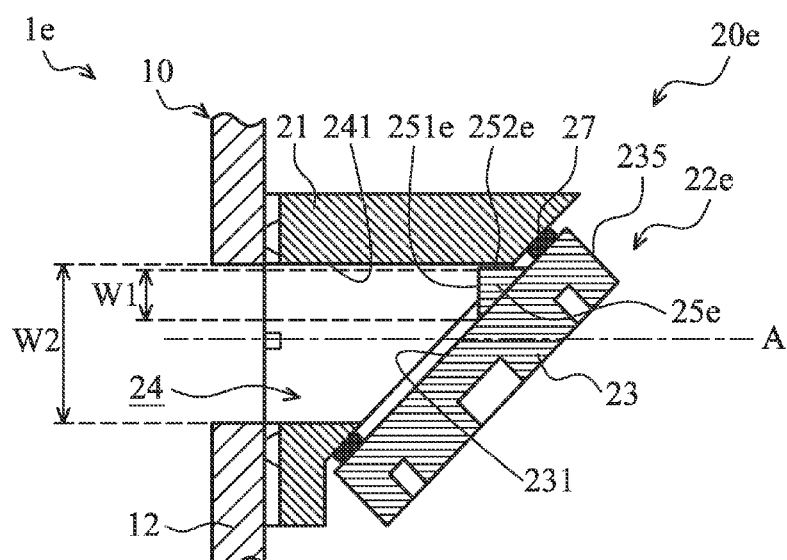
FIG. 9 is a partial cross-sectional view of a wafer process apparatus, in accordance with some embodiments.

Referring to FIG. 9, a partial cross-sectional view of a wafer process apparatus 1e with a closed sealing module 20e is shown, in accordance with some embodiments. Differences between the sealing module 20e and the sealing module 20 include the closure member 22 being replaced by a closure member 22e. The closure member 22e includes the main body 23 and a barrier 25e. The barrier 25e is positioned on the front surface 231 of the main body 23 and located adjacent to the upper edge 235. In some embodiments, the barrier 25e includes a first lateral surface 251e and a second lateral surface 252e.

When the sealing member 20e is in closed state, the first lateral surface 251e is perpendicular to the extending axis A of the passage 24. In addition, the second lateral surface 252e is adjacent to the top wall 241 of the passage, and a gap is defined between the second lateral surface 252e and the top wall 241. With such an arrangement, a better protection for the sealing member 27 located adjacent to the upper edge 235 is achieved. In some embodiments, the ratio of the width W1 of the first lateral surface 251e in a vertical direction and the width W2 of the passage 24 in the vertical direction is greater than 0 and less than about 1. Since the barrier 25e has a smaller volume, a reduction of manufacturing cost is realized.

Figure 10A:
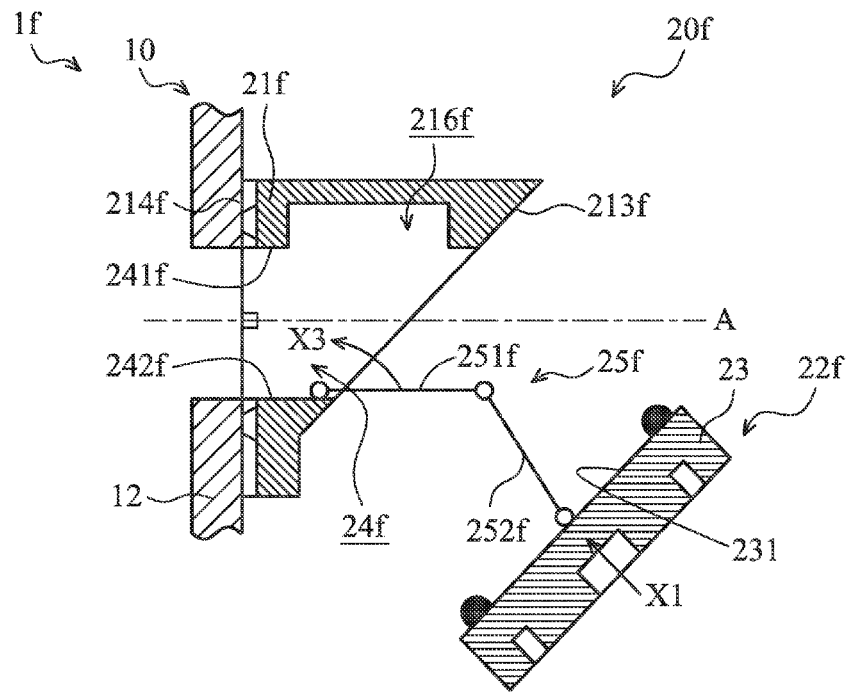
FIGS. 10A-10B are cross-sectional views of stages of a process for closing a sealing module, in accordance with some embodiments.
Figure 10B:
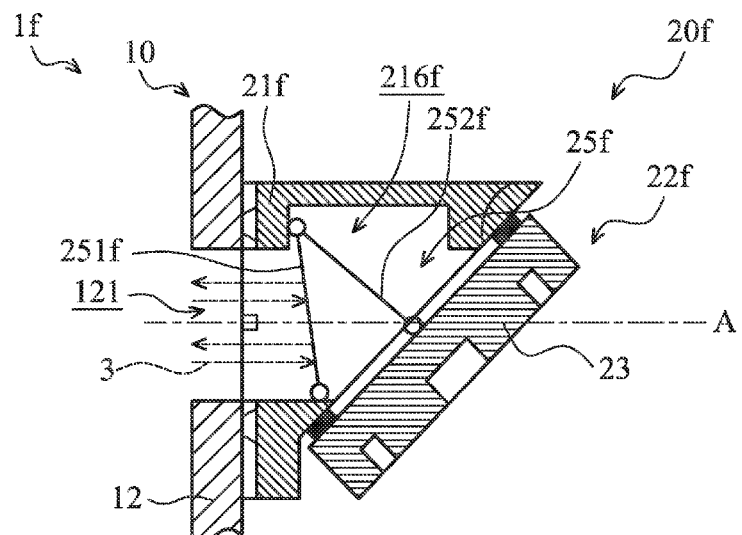

Referring to FIG. 10, a partial cross-sectional view of a wafer process apparatus 1f with an open sealing module 20f is shown, in accordance with some embodiments. The sealing module 20f includes a seat member 21f, a closure member 22f, and the sealing member 27. In some embodiments, the seat member 21f has an outer surface 213f and an inner surface 214f, and a passage 24f penetrates the outer surface 213f and the inner surface 214f. The passage 24f substantially extends along an extending axis A and communicates with the opening 121 of the lateral panel 12. In some embodiments, the extending axis A is horizontal. The passage 24f has a top wall 241f and a bottom wall 242f opposite to the top wall 241f. The top wall 241f and the bottom wall 242f are parallel to the extending axis A and respectively connect the inner surface 214f to the outer surface 213f. In some embodiments, a recessed portion 216f is formed on the top wall 241f of the passage 24f.

In some embodiments, the closure member 22f includes the main body 23 and a barrier 25f. The barrier 25f comprises a number of linkages, such as the linkages 251f and 252f, which are pivotably connected to each other. The linkage 251f is pivotably connected to the bottom wall 242f of the passage 24, and the linkage 252f is pivotably connected to the front surface 231 of the main body 23. In some embodiments, the linkages 251f and 252f are elongated plates and made of anti-corrosion material, such aluminum, tefon, ceramic, aluminum oxide, silicon carbon, aluminum nitride, etc.

In some embodiments, to close the sealing module 20f, the closure member 22f is moved along the transferring direction X2. While at the same time, the linkage 251f is rotated along a third direction X3. When the sealing module 20f is in closed state, both of the linkages 251f and 252f are placed inside of the passage 24f, and the intersection of the linkage 251f and the linkage 252f is located in the recessed portion 216f. With such an arrangement, the processing elements 3 from the processing module 10 is blocked by the linkage 251f, the exposure of the sealing member 27 to the processing elements 3 is prevented.

Figure 11A:
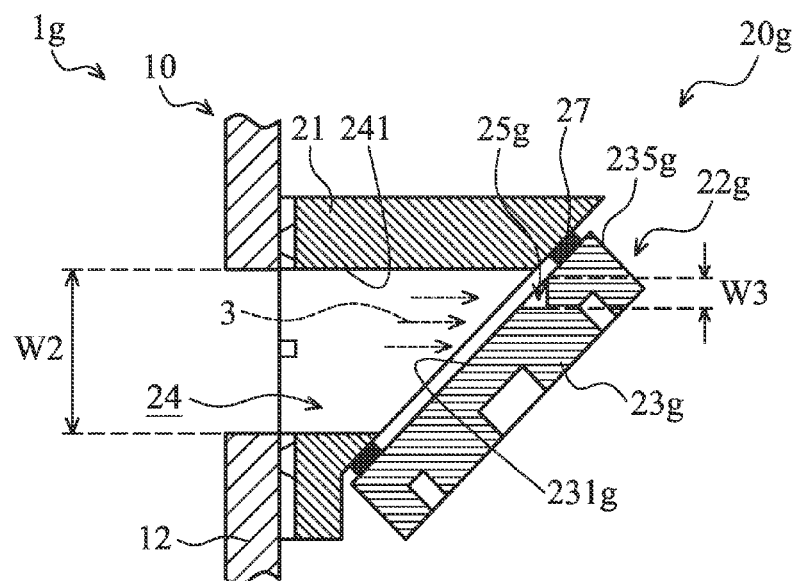
FIG. 11A is a partial cross-sectional view of a wafer process apparatus, in accordance with some embodiments.

Referring to FIG. 11A, a partial cross-sectional view of a wafer process apparatus 1g with a closed sealing module 20g is shown, in accordance with some embodiments. Differences between the sealing module 20g and the sealing module 20 include the closure member 22 being replaced by a closure member 22g.

Figure 11B:
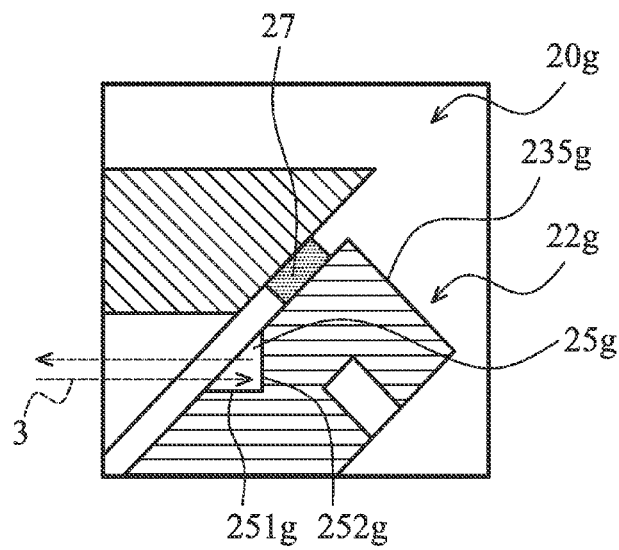
FIG. 11B is an enlarged view of a wafer process apparatus, in accordance with some embodiments.

In some embodiments, the closure member 22g includes a main body 23g and a barrier 25g. The main body 23g is an elongated structure and comprises a front surface 231g and an upper edge 235g. As shown in FIG. 11A, when the sealing module 20g is in closed state, the upper edge 235g is adjacent to the top wall 241. The barrier 25g is a depressed surface located at a position approximating the upper edge 235g of the main body 23g. As shown in FIG. 11B, the barrier 25g has a first lateral surface 251g and a second lateral surface 252g. The second lateral surface 252g is a vertical surface. The first lateral surface 251g is connected to the second lateral surface 252g at a suitable angle. In some embodiments, the ratio between the width W3 of the second lateral surface 252g and the width W3 of the passage 24 is greater than 0 and less than about 0.33. It is appreciated that the number of barriers 25g should not be limited to the above-mentioned embodiments. In some non-illustrated embodiments, the closure member 22g includes a number of barriers 25g arranged along a traversal direction of the main body 23g.

Referring to FIGS. 11A and 11B, in some embodiments, when the processing module 10 is in operation, the processing elements 3 enter the sealing module 20g. However, the processing elements 3 are reflected by the second lateral surface 252g and do not strike on the sealing member 27 located adjacent to the upper edge 235g. Therefore, the exposure of the sealing member 27 to the processing elements 3 is prevented.

Figure 12:
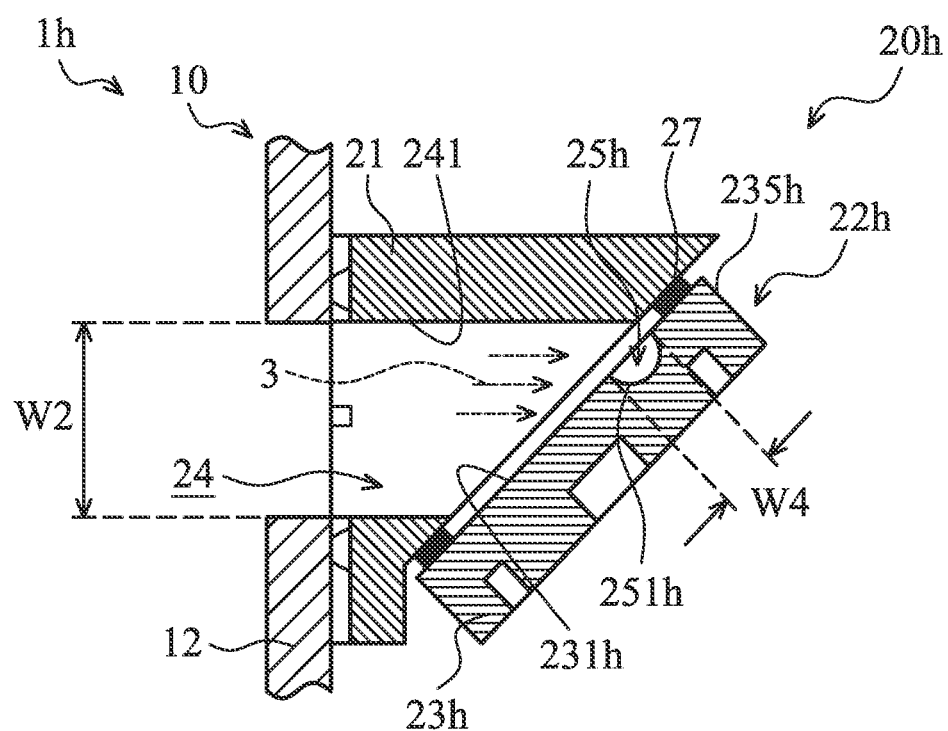
FIG. 12 is a partial cross-sectional view of a wafer process apparatus, in accordance with some embodiments.

Referring to FIG. 12, a partial cross-sectional view of a wafer process apparatus 1h with a closed sealing module 20h is shown, in accordance with some embodiments. Differences between the sealing module 20h and the sealing module 20 include the closure member 22 being replaced by a closure member 22h.

In some embodiments, the closure member 22h includes a main body 23h and a barrier 25h. The main body 23h is an elongated structure and comprises a front surface 231h and an upper edge 235h. As shown in FIG. 12, when the sealing module 20h is in closed state, the upper edge 235h is adjacent to the top wall 241. The barrier 25h includes a curved surface depressed from the front surface 231h. In some embodiments, the barrier 25h is located at a position approximating the upper edge 235h of the main body 23h. In some embodiments, the ratio between the width W4 of the barrier 25h and the width W2 of the passage 24 is in a range from is greater than 0 and less than about 0.33.

In some embodiments, when the processing module 10 is in operation, the processing elements 33 enter the sealing module 20g. However, the processing elements 3 are reflected by the barrier 25h and do not strike on the sealing member 27 located adjacent to the upper edge 235g. Therefore, the exposure of the sealing member 27 to the processing elements 3 is prevented.

Embodiments of method for protecting a sealing member of a sealing module are provided. A barrier is positioned at a main body of a closure member. The moving path of process elements from a processing module is reflected or diverted by the barrier. Since the sealing member is not struck by the process elements, a problem of wear on the sealing member is avoided. Therefore, the airtight condition of the processing module is maintained by the sealing module, and wafer production yield is increased.

In accordance with some embodiments, a method for processing a wafer is provided. The method includes placing the wafer in a processing module via a passage of a seat member. The method also includes moving a closure member along a transferring direction that is different from an extending axis of the passage. The method further includes engaging the seat member and the closure member and defining a gap in the passage by the seat member and the closure member. In addition, the method includes performing a process on the wafer in the processing module.

In accordance with some embodiments, a method for processing a wafer is provided. The method includes placing the wafer in a processing module via a passage of a seat member. The method also includes moving a closure member toward the seat member in a diagonal manner. The method further includes engaging the seat member and the closure member and placing a portion of the closure member inside the passage. In addition, the method includes performing a process on the wafer in the processing module.

In accordance with some embodiments, a wafer process apparatus for processing a wafer is provided. The processing module includes a processing module. The processing module includes a lateral panel, and an opening is formed on the lateral panel. The wafer process apparatus also includes a sealing module. The sealing module includes a seat member, a closure member, and a sealing member. The seat member has an outer surface. A passage penetrates the outer surface and communicates to the opening. The closure member includes a main body and a barrier. The main body has a front surface adapted to engage with the outer surface of the seat member. The barrier is positioned at the front surface. When the closure member engages with the seat member, the barrier is inside the passage, and the sealing member surrounds the barrier Although the embodiments and their advantages have been described in detail, it should be understood that various changes, substitutions, and alterations can be made herein without departing from the spirit and scope of the embodiments as defined by the appended claims. Moreover, the scope of the present application is not intended to be limited to the particular embodiments of the process, machine, manufacture, composition of matter, means, methods, and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the disclosure. Accordingly, the appended claims are intended to include within their scope such processes, machines, manufacture, compositions of matter, means, methods, or steps. In addition, each claim constitutes a separate embodiment, and the combination of various claims and embodiments are within the scope of the disclosure.

What is claimed is:

1. A wafer process apparatus for processing a wafer, comprising:
   a processing module comprising a lateral panel, wherein an opening is formed on the lateral panel for access of the wafer into the processing module, the wafer being movable into and out of the processing module through the opening in a transfer axis extending through the opening; and
   a sealing module, comprising:
   a seat member, having an outer surface and an inner surface, wherein a passage is formed in the seat member, and two ends of the passage are respectively formed on the outer surface and the inner surface, with the two ends being arranged on a passage axis passing through the opening and parallel to the transfer axis;
   a closure member comprising a main body having a front surface adapted to engage with the outer surface of the seat member and a barrier positioned at the front surface; and
   a sealing member, wherein when the closure member engages with the seat member, the barrier is arranged across a plane on which the outer surface of the seat member is located, and the sealing member surrounds the barrier;
   wherein the barrier comprises a first lateral surface immediately connected to the front surface of the main body, and when the closure member engages with the seat member, the first lateral surface is substantially perpendicular to the passage axis along which the passage extends.

2. The wafer process apparatus as claimed in claim 1, wherein the barrier further comprises a second lateral surface adjacent to a top wall of the passage, wherein when the closure member is engaged with the seat member, a gap is defined between the second lateral surface and the top wall, and the gap extends along a direction substantially parallel to the passage axis along which the passage extends.

3. The wafer process apparatus as claimed in claim 2, wherein the width of the gap is in a range from about 0.2 mm to about 2.0 mm.

4. The wafer process apparatus as claimed in claim 2, wherein the width of the gap is in a range from about 0.2 mm to about 2.0 mm.

5. The wafer process apparatus as claimed in claim 1, wherein the barrier further comprises a second lateral surface, and a top surface parallel to the front surface, wherein the first lateral surface and the second lateral surface respectively connect two opposite sides of the top surface to the front surface, and an angle formed between the first lateral surface and the front surface is different from an angle formed between the second lateral surface and the front surface.

6. The wafer process apparatus as claimed in claim 1, wherein at least one recessed portion is formed on a top wall of the passage, and the configuration of the recessed portion is compatible with the configuration of a portion of the barrier that inserted into the recessed portion when the closure member is engaged to the seat member.

7. The wafer process apparatus as claimed in claim 1, wherein at least one recessed portion is formed on a top wall of the passage, and the recessed portion comprises a first recessed surface and a second recessed surface connecting the first recessed surface to the top wall of the passage, wherein an angle formed between the second recessed surface and the top wall of the passage is in a range from about 90 degrees to about 180 degrees.

8. The wafer process apparatus as claimed in claim 1, wherein the barrier further comprises a second lateral surface adjacent to a top wall of the passage, wherein when the closure member is engaged with the seat member, a gap is defined between the second lateral surface and the top wall, the gap has a zigzag manner.

9. The wafer process apparatus as claimed in claim 1, wherein a portion of the first lateral surface is located under a bottom wall of the passage.

10. The wafer process apparatus as claimed in claim 1, wherein an angle formed between a top wall of the passage and the outer surface of the seat member is greater than 90 degrees, and a gap with a constant width is formed between the barrier and the top wall of the passage.

11. A wafer process apparatus for processing a wafer, comprising:
   a processing module, having an opening for access of the wafer into the processing module, the wafer being movable into and out of the processing module through the opening in a transfer axis extending through the opening; and
   a sealing module connected to the processing module and comprising:
   a seat member, having a passage for the access of the wafer into the processing module, wherein two ends of the passage are respectively located on an outer surface and an inner surface of the seat member, with the two ends being arranged on a passage axis passing through the opening and parallel to the transfer axis;
   a closure member comprising a main body detachably connected to the seat member and a barrier extending toward the passage from a front surface of the main body;
   a sealing member positioned between the front surface of the main body and the outer surface of the seat member to seal the passage,
   wherein the barrier comprises a first lateral surface immediately connected to the front surface of the main body, and when the closure member engages with the seat member, the first lateral surface is substantially perpendicular to the passage axis, and the sealing member is positioned on a plane which is inclined to the passage axis.

12. The wafer process apparatus as claimed in claim 11, wherein the barrier further comprises a second lateral surface connecting to the first lateral surface and adjacent to a top wall of the passage, wherein when the closure member is engaged with the seat member, a gap is defined between the second lateral surface, and the gap extends along a direction substantially parallel to the passage axis along which the passage extends.

13. The wafer process apparatus as claimed in claim 11, wherein the barrier further comprises a second lateral surface connecting to the first lateral surface and adjacent to a top wall of the passage, wherein when the closure member is engaged with the seat member, a gap is defined between the second lateral surface and the top wall, the gap has a zigzag manner.

14. The wafer process apparatus as claimed in claim 11, wherein the barrier further comprises a second lateral surface, and a top surface parallel to the front surface, wherein the first lateral surface and the second lateral surface respectively connect two opposite sides of the top surface to the front surface, and an angle formed between the first lateral surface and the front surface is different from an angle formed between the second lateral surface and the front surface.

15. The wafer process apparatus as claimed in claim 11, wherein at least one recessed portion is formed on a top wall of the passage, and the configuration of the recessed portion is compatible with the configuration of a portion of the barrier that inserted into the recessed portion when the closure member is engaged to the seat member.

16. The wafer process apparatus as claimed in claim 11, wherein at least one recessed portion is formed on a top wall of the passage, and the recessed portion comprises a first recessed surface and a second recessed surface connecting the first recessed surface to the top wall of the passage, wherein an angle formed between the second recessed surface and the top wall of the passage is in a range from about 90 degrees to about 180 degrees.

17. The wafer process apparatus as claimed in claim 11, wherein the outer surface of the seat member is inclined to the passage axis at an angle ranging from about 90 degrees to about 135 degrees.

18. The wafer process apparatus as claimed in claim 11, wherein when the closure member engages with the seat member, the barrier is arranged across the plane on which the outer surface of the seat member is located.

19. The wafer process apparatus as claimed in claim 11, wherein a portion of the first lateral surface is located under a bottom wall of the passage.

20. A wafer process apparatus for processing a wafer, comprising:
   a processing module, having an opening for access of the wafer into the processing module, the wafer being movable into and out of the processing module through the opening in a transfer axis extending through the opening; and
   a sealing module connected to the processing module and comprising:
   a seat member, having a passage for the access of the wafer into the processing module, wherein two ends of the passage are respectively located on an outer surface and an inner surface of the seat member, with the two ends being arranged on a passage axis passing through the opening and parallel to the transfer axis;

a closure member comprising a main body detachably connected to the seat member and a barrier extending toward the passage from a front surface of the main body;

a sealing member positioned between the front surface of the main body and the outer surface of the seat member to seal the passage, wherein the barrier comprises a first lateral surface immediately connected to the front surface of the main body, and when the closure member engages with the seat member, the first lateral surface is substantially perpendicular to the passage axis, and the sealing member is positioned on a plane which is inclined to the passage axis;

wherein an angle formed between a top wall of the passage and the outer surface of the seat member is greater than 90 degrees, and a gap with a constant width is formed between the barrier and the top wall of the passage.

* * * * *